(12) United States Patent
Werner et al.

(10) Patent No.: US 12,604,434 B2
(45) Date of Patent: Apr. 14, 2026

(54) ELIMINATING EXTERNAL AIR INFILTRATION IN EDGE CONTAINERS

(71) Applicant: INTERNATIONAL BUSINESS MACHINES CORPORATION, Armonk, NY (US)

(72) Inventors: John S. Werner, Fishkill, NY (US); John Torok, Poughkeepsie, NY (US); Dustin Demetriou, New York, NY (US); Arkadiy O. Tsfasman, Wappingers Falls, NY (US); Noah Singer, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 496 days.

(21) Appl. No.: 18/356,343

(22) Filed: Jul. 21, 2023

(65) Prior Publication Data

US 2025/0031337 A1      Jan. 23, 2025

(51) Int. Cl.
H05K 7/20 (2006.01)

(52) U.S. Cl.
CPC ..... H05K 7/20145 (2013.01); H05K 7/20718 (2013.01)

(58) Field of Classification Search
CPC ............ H05K 7/1497; H05K 7/20145; H05K 7/20618; H05K 7/20718; H05K 7/20745; F24F 3/167; E04B 2002/7498
See application file for complete search history.

(56) References Cited

U.S. PATENT DOCUMENTS 11,533,826 B2    12/2022  Gao
2011/0083824 A1*  4/2011  Rogers ............... H05K 7/20754
                                         312/236

(Continued)

FOREIGN PATENT DOCUMENTS

CN        210425722 U      4/2020
CN        210886209 U      6/2020

(Continued)

OTHER PUBLICATIONS

Panel Built Incorporated, "Security Vestibules | Ballistic & Bullet-Resistant Vestibules," panelbuilt.com [datasheet], [accessed on Jan. 13, 2023], 2 pages, Retrieved from the Internet: <URL: https://www.panelbuilt.com/products/security-vestibules>.

*Primary Examiner* — Steven B McAllister
*Assistant Examiner* — Michael James Giordano
(74) *Attorney, Agent, or Firm* — Teddi E. Maranzano

(57)                ABSTRACT

A method, system, and computer program product are provided. Fan speed is determined for one or more air conditioning unit (ACU) fans and stored to computer memory in response to detecting a request for authorized entrance to the modular data center. ACU fans are adjusted in preparation to deploying retractable baffles that, when deployed, form a temporary vestibule within a space of the modular data center. The retractable baffles are deployed to form the temporary vestibule within the space of the modular data center. Computing resources in the modular data center are shielded from contaminant air that enters the temporary vestibule when the external door is open. The external door is unlocked to allow user entrance to the temporary vestibule. When the external door closes, air is purged from the temporary vestibule. Retractable baffles are retracted. The fan speeds are restored from the computer memory.

20 Claims, 11 Drawing Sheets

Temperature 275

TEMPERATURE (C)
35
30.8
26.5
22.3
18

Exhaust Vent 235
Exhaust Plenum 230
Roll Up Door and Baffles Deployed 226

Orientation 270
Y
Z  X

IT Equipment 210
ACU 215
External Door 240

(56)           References Cited

U.S. PATENT DOCUMENTS

| | | | |
|---|---|---|---|
| 2018/0268861 A1* | 9/2018 | Miranda Gavillan | G11B 15/68 |
| 2019/0171799 A1* | 6/2019 | Crawford ............. | H05K 7/1495 |

FOREIGN PATENT DOCUMENTS

| | | |
|---|---|---|
| CN | 112770611 A | 5/2021 |
| CN | 115406092 A | 11/2022 |
| JP | 2007024326 A | 2/2007 |
| JP | 2008190818 A | 8/2008 |

* cited by examiner

100

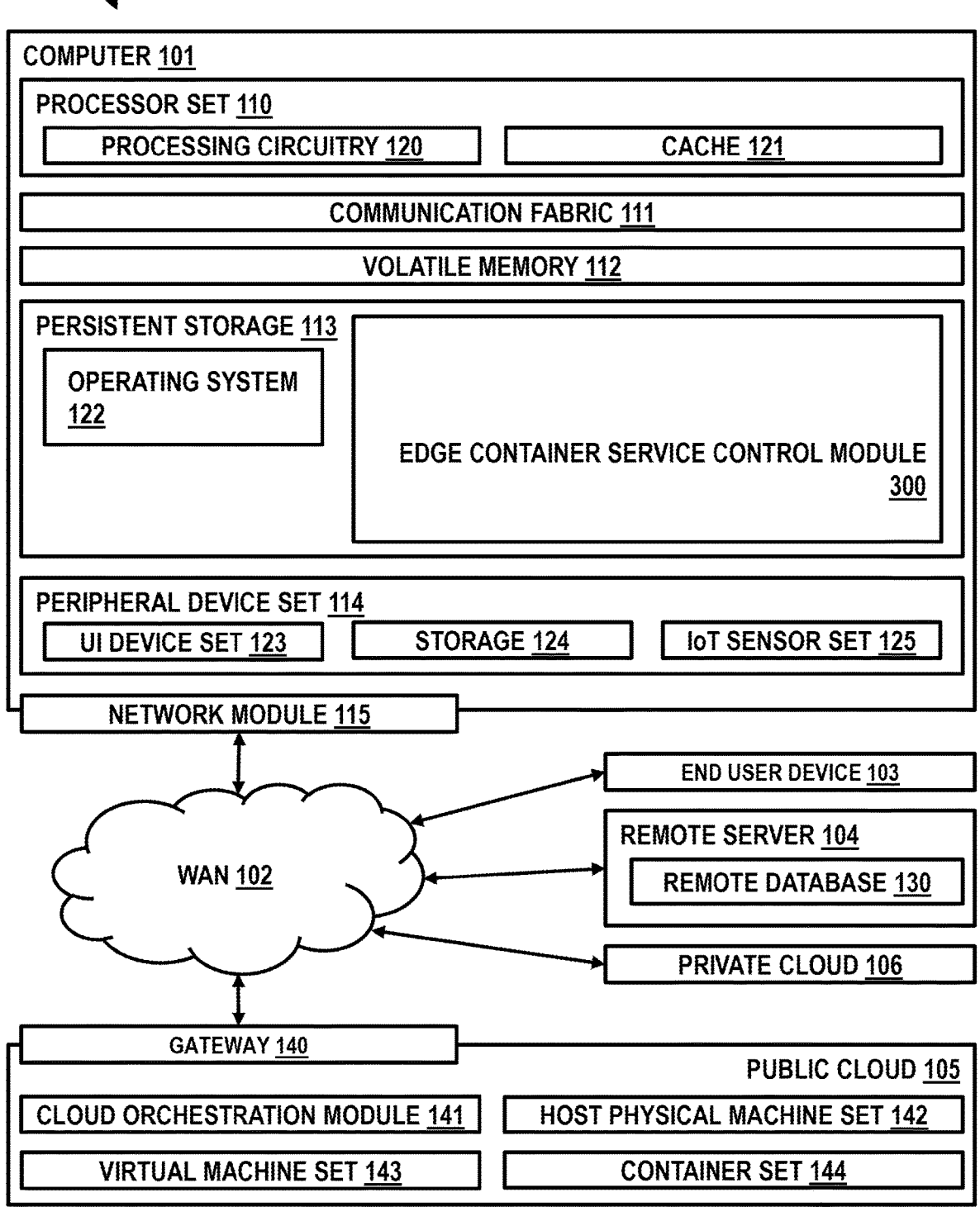

COMPUTER 101

PROCESSOR SET 110

PROCESSING CIRCUITRY 120          CACHE 121

COMMUNICATION FABRIC 111

VOLATILE MEMORY 112

PERSISTENT STORAGE 113

OPERATING SYSTEM 122

EDGE CONTAINER SERVICE CONTROL MODULE 300

PERIPHERAL DEVICE SET 114

UI DEVICE SET 123          STORAGE 124          IoT SENSOR SET 125

NETWORK MODULE 115

WAN 102

END USER DEVICE 103

REMOTE SERVER 104

REMOTE DATABASE 130

PRIVATE CLOUD 106

GATEWAY 140

PUBLIC CLOUD 105

CLOUD ORCHESTRATION MODULE 141          HOST PHYSICAL MACHINE SET 142

VIRTUAL MACHINE SET 143          CONTAINER SET 144

400
Door open: Flow into container = 147.8 cfm
Exhaust Vent
235
Exhaust Plenum
230
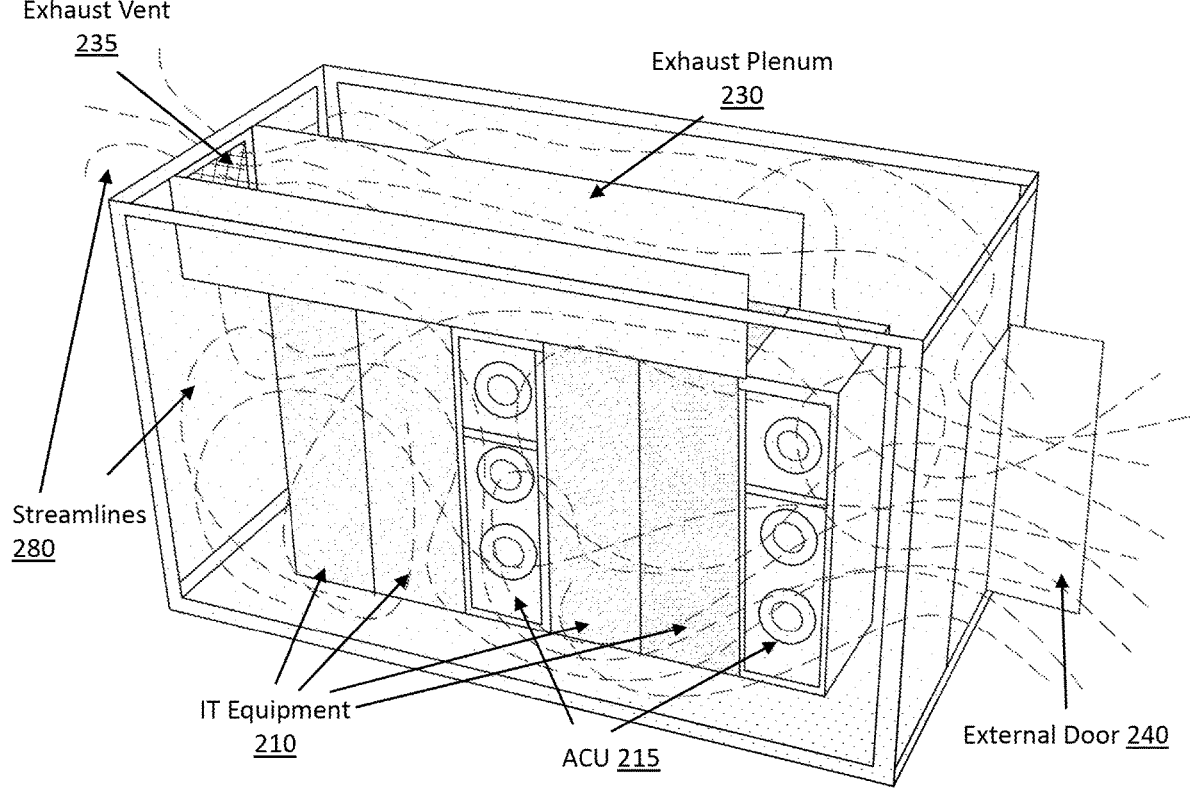
Streamlines
280
IT Equipment
210
ACU 215
External Door 240
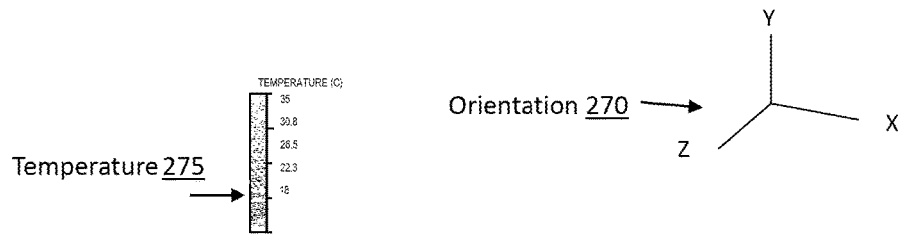
Temperature 275
Orientation 270
FIG. 4

500
Door open: Flow into container = 53.8 cfm
Exhaust Vent
235
Exhaust Plenum
230
Retractable Baffles
Deployed
225
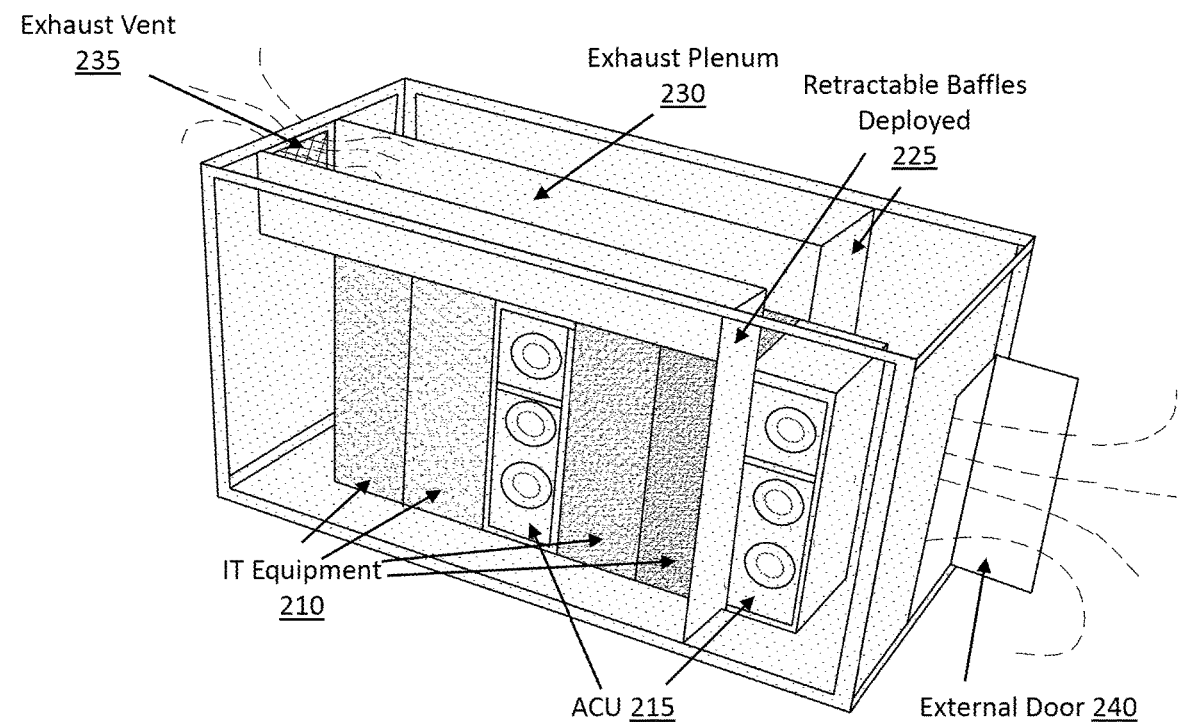
IT Equipment
210
ACU 215
External Door 240
TEMPERATURE (C)
35
30.8
26.5
22.3
18
Temperature 275
Orientation 270
Y
X
Z
FIG.5

<u>600</u>                                    Flow into container = 1.2 cfm
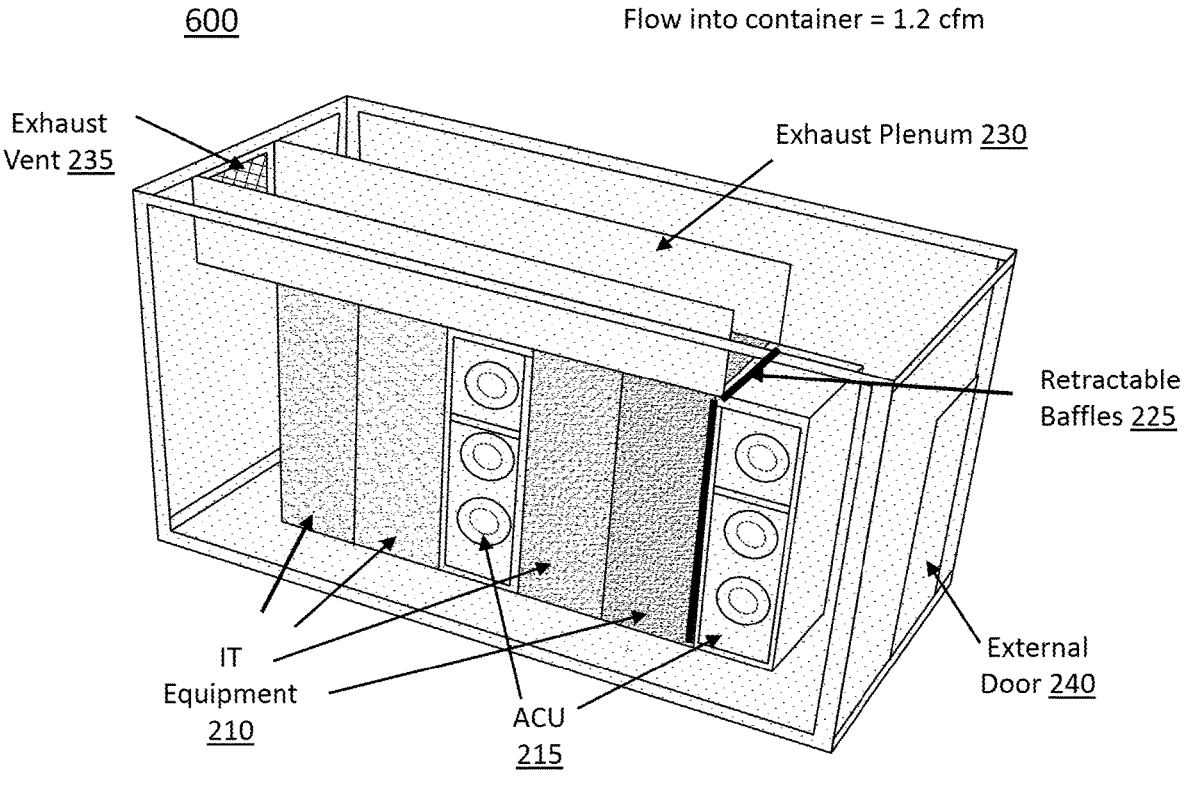
Exhaust Vent <u>235</u>
Exhaust Plenum <u>230</u>
Retractable Baffles <u>225</u>
External Door <u>240</u>
IT Equipment <u>210</u>
ACU <u>215</u>
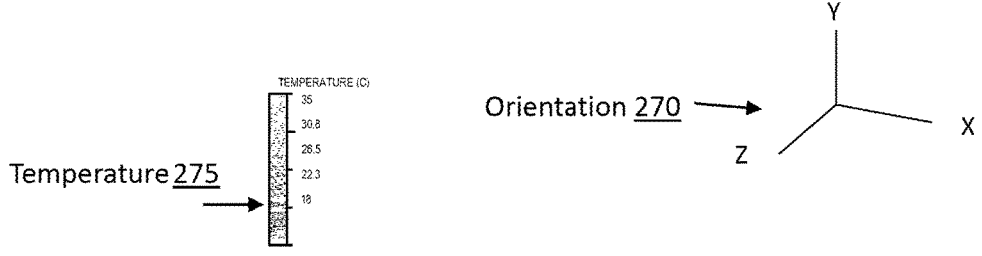
TEMPERATURE (C)
35
30.8
26.5
22.3
18
Temperature <u>275</u>
Orientation <u>270</u>
Y
X
Z
FIG. 6

Temperature 275

TEMPERATURE (C)

35
30.8
26.5
22.3
18

Exhaust Vent 235

Exhaust Plenum 230

Roll Up Door and Baffles Deployed 226

Orientation 270

Y
X
Z

IT Equipment 210

ACU 215

External Door 240

Temperature <u>275</u>
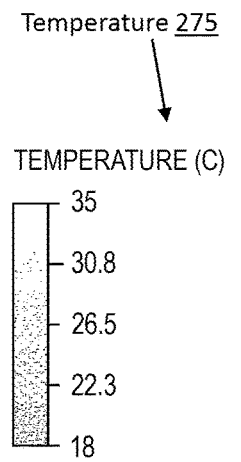
Exhaust Vent <u>235</u>     Exhaust Plenum <u>230</u>     Overhead Garage Door Deployed <u>227</u>     Overhead Door Supports <u>228</u>
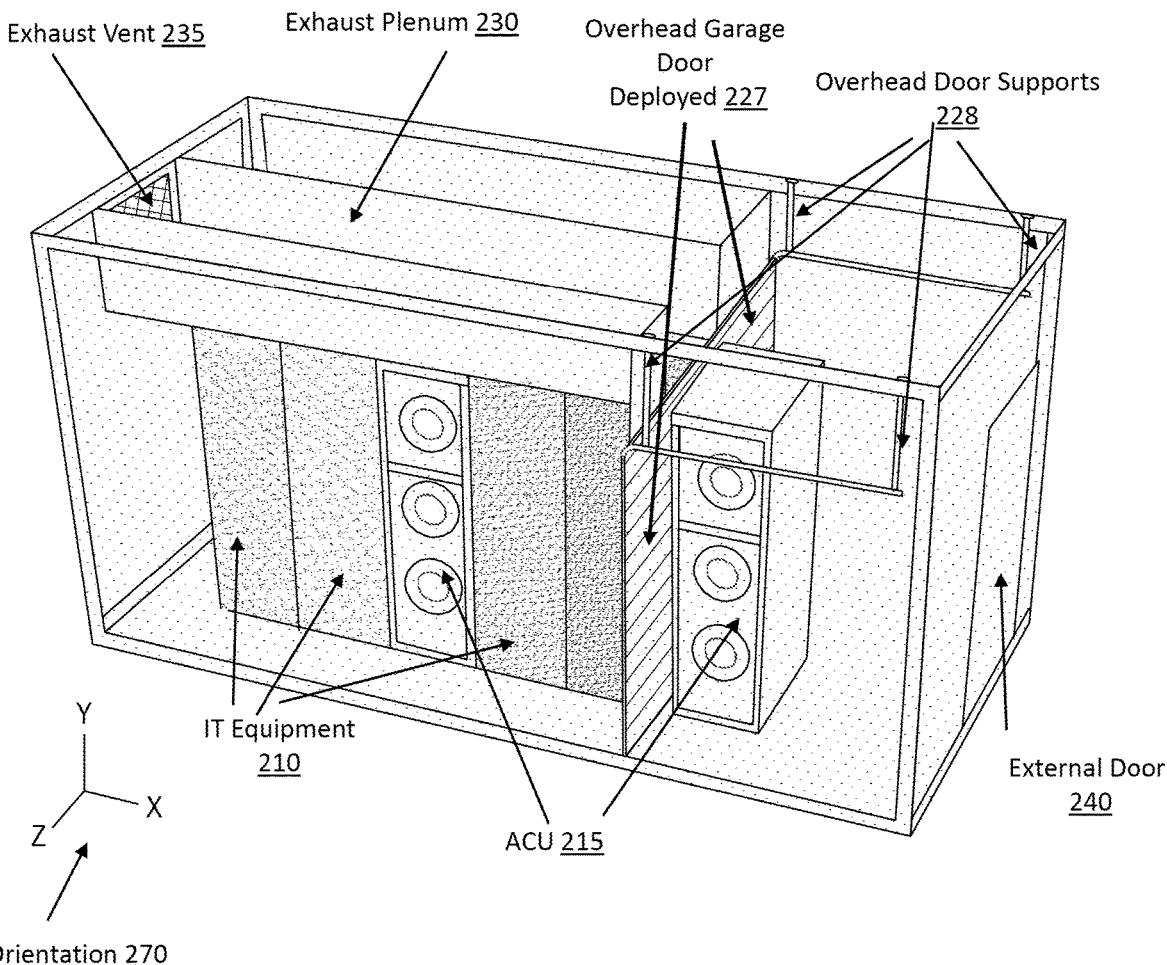
IT Equipment <u>210</u>
ACU <u>215</u>
External Door <u>240</u>
Orientation <u>270</u>
FIG. 9

Temperature 275
TEMPERATURE (C)
35
30.8
26.5
22.3
18
Exhaust Vent 235
Exhaust Plenum 230
Overhead Garage Door Retracted 227
Overhead Door Supports 228
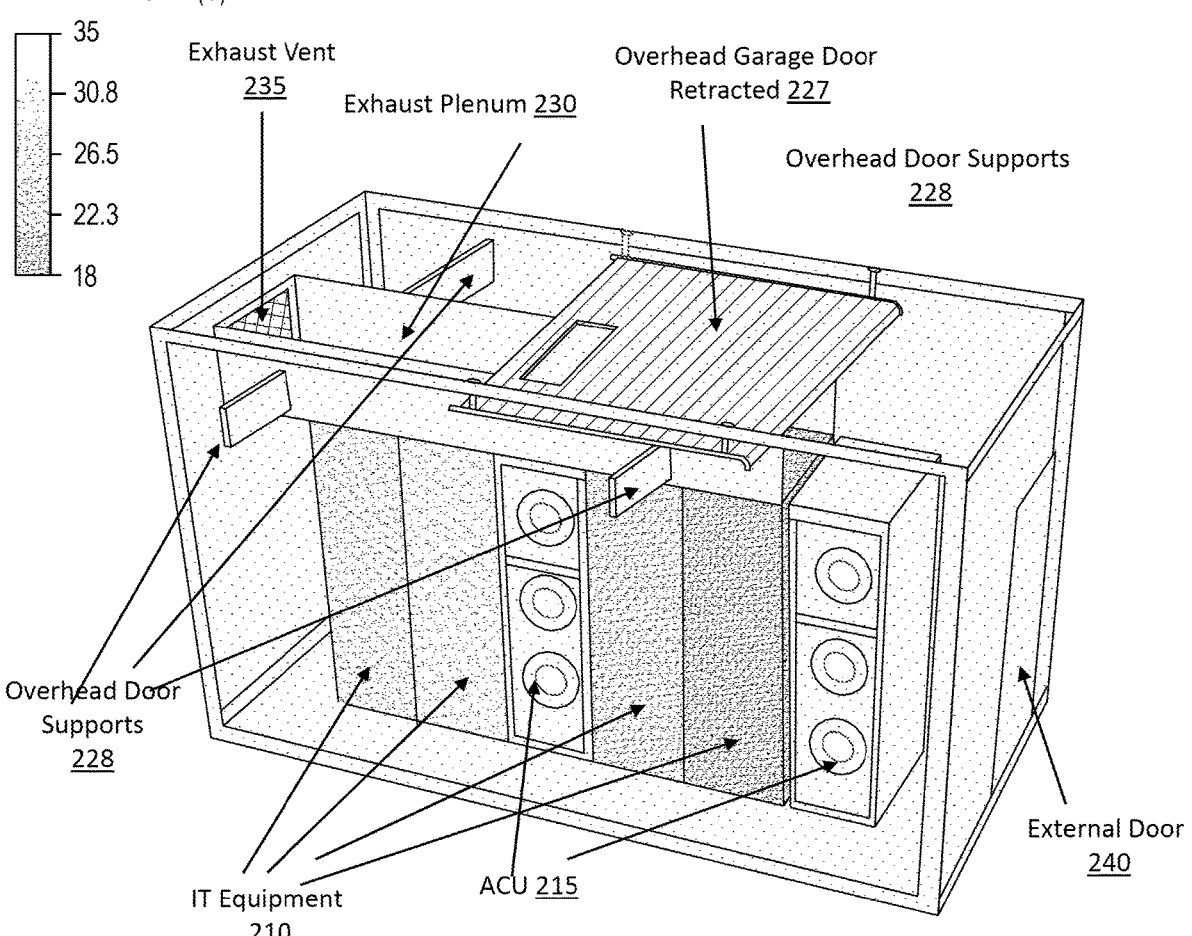
Overhead Door Supports 228
IT Equipment 210
ACU 215
External Door 240
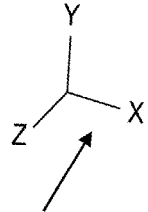
Orientation 270
FIG. 10

ELIMINATING EXTERNAL AIR INFILTRATION IN EDGE CONTAINERS

BACKGROUND

The present invention relates to computer systems, and more specifically to eliminating external air infiltration in edge containers.

Edge data centers act as a caching and data-aggregation point between users and larger data centers to ease overwhelming information technology (IT) loads.

Space inside an edge container, also known as a modular data center, is limited, and the environment outside the edge container is uncontrolled. Therefore, an open edge container door can expose and potentially damage the equipment inside due to contaminants in the air or due to change in air temperature outside the operating range of the equipment. Damage from air contaminants is of particular concern because, when used in an IT environment, many compute devices are not equipped with filtered bezels for protection.

It would be advantageous to provide a system to prevent the infiltration of external air being consumed by equipment in an edge container during an opening of an exterior container door exposed to the outdoors, thereby preventing damage to the equipment.

SUMMARY

A method is provided. Fan speeds are determined for one or more air conditioning unit (ACU) fans and stored to computer memory in response to detecting a request for authorized entrance to the modular data center. ACU fans are adjusted in preparation to deploying retractable baffles that, when deployed, form a temporary vestibule within a space of the modular data center. The retractable baffles are deployed to form the temporary vestibule within the space of the modular data center. Computing resources in the modular data center are shielded from contaminant air that enters the temporary vestibule when the external door is open. The external door is unlocked to allow user entrance to the temporary vestibule. When the external door closes, air is purged from the temporary vestibule. Retractable baffles are retracted. The fan speeds are restored from the computer memory.

Embodiments are further directed to a computer program product, comprising a non-transitory tangible storage device having program code embodied therewith, the program code executable by a processor of a computer to perform a method. The method comprises determining one or more fan speeds for air conditioning unit (ACU) fans and storing the fan speeds to a computer memory for later recall in response to detecting a request for authorized entrance to a modular data center; adjusting the ACU fans in preparation to deploying one or more retractable baffles that, when deployed, form a temporary vestibule within a space of the modular data center; deploying the one or more retractable baffles to form the temporary vestibule within the space of the modular data center, thereby shielding computing resources in the modular data center from contaminant air that enters the temporary vestibule when the external door is open, unlocking the external door to allow entry to the temporary vestibule; detecting the entry into the temporary vestibule and closure of the external door; purging the contaminant air from the temporary vestibule; retracting the one or more retractable baffles, exposing computing resources in the modular data center to the space used for the temporary vestibule; and restoring the fan speeds from the computer memory.

Embodiments are further directed to a computer system, comprising one or more processors; a memory coupled to at least one of the processors; a set of computer program instructions stored in the memory and executed by at least one of the processors in order to perform actions of: determining one or more fan speeds for air conditioning unit (ACU) fans and storing the fan speeds to a computer memory for later recall in response to detecting a request for authorized entrance to a modular data center; adjusting the ACU fans in preparation to deploying one or more retractable baffles that, when deployed, form a temporary vestibule within a space of the modular data center; deploying the one or more retractable baffles to form the temporary vestibule within the space of the modular data center, thereby shielding computing resources in the modular data center from contaminant air that enters the temporary vestibule when the external door is open, unlocking the external door to allow entry to the temporary vestibule; detecting the entry into the temporary vestibule and closure of the external door; purging the contaminant air from the temporary vestibule; retracting the one or more retractable baffles, exposing computing resources in the modular data center to the space used for the temporary vestibule; and restoring the fan speeds from the computer memory.

An apparatus for eliminating infiltration of external air being consumed by IT equipment operating in an edge computing container during an opening of an external door exposed to outdoors is provided. The apparatus comprises a plurality of IT equipment, comprising compute, networking, and storage equipment, wherein the plurality of IT equipment is loaded into one or more racks in the edge computing container; one or more retractable baffles, connected to one or more interior surfaces of the edge computing container; a plurality of ACUs; an external door having a security verification device; one or more retractable baffles; a temporary vestibule formed between the one or more retractable baffles, when deployed, and the external door, wherein at least one ACU is within the temporary vestibule, and wherein the remaining ACUs and the plurality of IT equipment are not in the temporary vestibule; and an exhaust plenum having a first end opening into the temporary vestibule, and a second end coupled to an exhaust fan in an opening in a wall of the edge computing container.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

FIG. 1 illustrates the operating environment of a computer server embodying a system for eliminating external air infiltration in edge containers;

FIG. 4 illustrates an exemplary edge container 400 without the baffles of the present invention installed;

FIG. 5 illustrates an exemplary edge container 500 with baffles deployed;

FIG. 6 illustrates an exemplary edge container 600 with baffles retracted;

FIG. 9 illustrates an exemplary edge container with the baffles of FIG. 8 deployed;

FIG. 10 illustrates an exemplary edge container with another embodiment having baffles being an overhead baffles.

DETAILED DESCRIPTION

Figure 2:
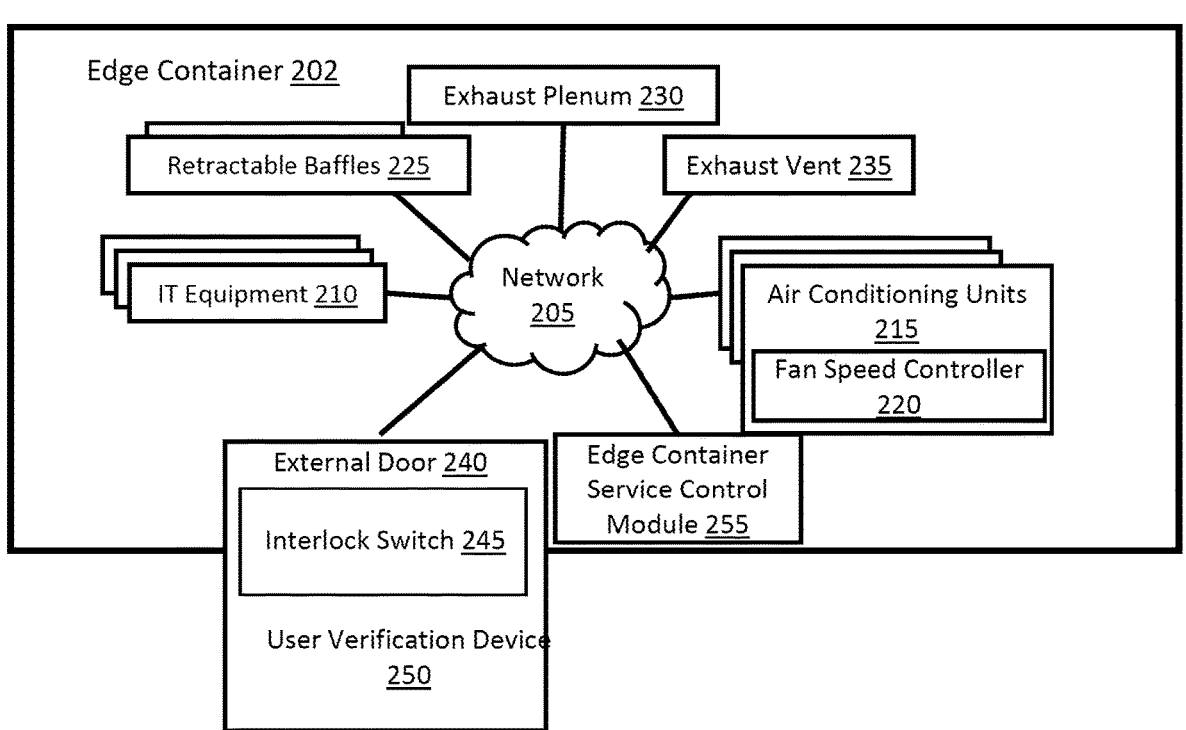
FIG. 2 illustrates an exemplary network flow diagram, in accordance with one or more aspects of the present invention.

Edge containers, also known as modular data centers, are decentralized computing resources located as close as possible to the end user in order to reduce latency, save bandwidth, and enhance the overall digital experience. Due to their advantages, such as quick deployment, scalable capacity for implementation anywhere, and ability to safeguard the internal computing resources, edge containers are becoming popular adjuncts to the traditional data center.

Characteristics of an edge container include: self-supporting construction, such that the edge container can be lifted and transported; capable of housing the entire physical infrastructure of a data center, such as power supply and uninterruptible power supply (UPS), one or more air conditioning, fire protection, and physical security apparatuses; monitoring and management equipment, including network infrastructure; one or more racks into which various compute/network/storage devices are installed; assorted cable containment systems.

In addition to these characteristics, embodiments of the present invention include: one or more retractable baffles which deploy to form a temporary vestibule between the entrance to the edge container and the computing equipment; an exhaust plenum paired with an exhaust vent, that exhausts air introduced into the edge container through the open entrance.

As in a traditional data center, physical access to the equipment inside an edge container is necessary, particularly for servicing and upgrading the equipment. Just as both access and climate in a data center is controlled to provide the optimal operating environment for the equipment, the environment in an edge container is similarly controlled. However, controlling the environment within an edge container presents a challenge. Because space is so limited in an edge container and the environment outside the edge container is uncontrolled, an open edge container door can expose and potentially damage the internal IT equipment due to contaminants in the air or the change in air temperature outside the operating range of the IT equipment.

Embodiments of the present invention provide a system, method, computer program product, and apparatus to protect equipment in an edge container from uncontrolled fluctuations in temperature and air quality due to opening the external door to the edge container. Although described in terms of IT equipment in an edge container, embodiments of the present invention can be implemented in other applications where the edge container contents require similar temperature and air quality protection.

To illustrate the state of the current art, FIG. 4 illustrates an exemplary edge container with the external door 240 in an open position. Access around the interior of the edge container is unobstructed, and air freely circulates around the interior. The edge container includes several racks of IT equipment 210, comprising a combination of compute servers, routers, storage servers, and other similar equipment. The edge container also includes adjustable cooling units (ACU) 215. There is an exhaust plenum 230 attached to an exhaust vent 235 that is an opening in a wall of the edge container. The exhaust plenum 230 is attached to the ceiling of the edge container and works in conjunction with the ACUs 215 to circulate air, shown as streamlines 280, and maintain the proper operating temperature. The temperature scale 275 depicts an exemplary scale of the temperature inside the edge container. The orientation 270 shows the 3-D spatial orientation of the edge container. Airflow into the container, 147.8 cfm, is estimated using computational fluid dynamics modeling, that predicts temperature and airflow distribution within the edge container based on the given boundary conditions and geometry.

To illustrate the environment of the present invention, FIG. 5 illustrates an exemplary edge container 202 with the retractable baffles 225 deployed. Labels shown in FIG. 5 are substantially the same as those similarly labeled in FIG. 4 and perform substantially the same function. Inside the edge container 202 the IT equipment 210, ACUs 215, exhaust plenum 230 and exhaust vent 235 are shown. The retractable baffles 225 are shown in the deployed position, in response to the external door 240 being opened.

When deployed, the retractable baffles 225 create a temporary vestibule that separates the IT equipment 210 from the external door 240. The retractable baffles 225 are deployed in response to a request to open an external door 240 prior to a user entering or exiting the edge container, as someone enters the temporary vestibule of the edge container. The ACU 215 fan speeds are adjusted to keep the IT equipment 210 within the operating temperature range defined for that equipment, and to pressurize the temporary vestibule. As shown in FIG. 5, at least one ACU 215 is located on each side of the retractable baffles 225. The exhaust plenum 230 carries air and potential contaminants that enter the temporary vestibule to the exhaust vent 235 that leads to the exterior of the edge container 202.

To further illustrate the environment of the present invention, FIG. 6 illustrates an exemplary edge container 202 with the retractable baffles 225 retracted. Labels shown in FIG. 6 are substantially the same as those similarly labeled in FIGS. 4-5, and perform substantially the same function. Notably, FIG. 6 shows the external door 240 being closed and the retractable baffles 225 are in the disengaged position. Therefore, there is no temporary vestibule.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation, or garbage collection, but this does not render the storage device as transitory because the data is not transitory while it is stored.

Beginning now with FIG. 1, an illustration is presented of the operating environment of a networked computer, according to an embodiment of the present invention.

Computing environment 100 contains an example of an environment for the execution of at least some of the computer code involved in performing the inventive methods, such as the edge container service control module (system) 300. In addition to block 300, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 300, as identified above), peripheral device set 114 (including user interface (UI), device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 300 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid-state storage devices. Operating system 122 may take several forms, such as various known proprietary operating systems or open-source Portable Operating System Interface type operating systems that employ a kernel. The code included in block 300 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, an administrator that operates computer 101), and may take any of the forms discussed above in connection with computer 101. For example, EUD 103 can be the external application by which an end user connects to the control node through WAN 102. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

FIG. 2 shows a network diagram 200 illustrating an edge container 202, its components, and its connectivity via the network 205.

The edge container 202 includes IT equipment 210, one or more ACUs 215, retractable baffles 225, an exhaust plenum 230, an exhaust vent 235, an external door 240, a user verification device 250, an interlock switch 245, and an edge container service control module 255 which are all interconnected via a wired and/or wireless network 205. The network 205 provides connectivity to one or more remote servers for various administrative purposes, including troubleshooting and configuring. End users access applications executing on the various IT equipment 210 through the network 205.

The wired and/or wireless network 205 may be any communication protocol that allows data to be transferred between components of the system (e.g., PCIe, I²C, Bluetooth, Wi-Fi, Cellular (e.g., 3G, 4G, 5G), Ethernet, fiber optics, etc.).

The IT equipment 210 includes any combination of one or more of compute, networking, or storage equipment, and may include any other combination of equipment or devices that require similar temperature and air quality protection.

The one or more ACUs 215 provide two functions. During normal operation, the ACUs 215 operate to keep the temperature of the IT equipment 210 within the defined operating range. During a service event, the ACUs 215 additionally ensure that external air entering the edge container 202 through the open external door 240 is blown out the exhaust vent 235.

In one or more embodiments, there are at least two ACUs 215 within the edge container 202, one of which can be a more simple and less expensive unit that is dedicated to use during a service event.

Each of the ACUs 215 includes a fan speed controller 220 which can change fan speeds based on the ambient temperature within edge container 202. The fan speed controller 220 responds to program instructions received from the edge container service control module 255 during normal operating conditions, and during a service event.

In response to either detecting the external door 240 is open or receiving a request to open the external door 240 prior to the door being opened, the edge container service control module 255 deploys the one or more retractable baffles. This creates a temporary vestibule between at least one ACU 215 and the external door 240. If entering, someone in the vestibule will close the external door 240 in order to cause the retractable baffles 225 to retract and allow access to the rest of the edge container 202. If exiting, someone will signal intent to leave, for example, at the external door 240 in order to deploy the retractable baffles 225. The external door 240 delays opening until the vestibule is created. The vestibule isolates all the IT equipment 210 from the changed air and temperature conditions caused by the opening of the external door 240. At least one of the ACUs 215 must be located in the temporary vestibule between the retractable baffles 225 and external door 240 to exhaust any external air that entered the edge container 202 while the external door 240 was open, and to generally equalize the temperature in the vestibule with that in the rest of the edge container 202. Once the edge container service control module 255 detects the temperature and air quality in the vestibule are within the operating range of the equipment, the edge container control module 255 directs the retractable baffles 225 to disengage, thereby allowing the service personnel entry to the entire edge container 202.

In one or more embodiments, the ACU 215 in the vestibule includes air filters. In one or more embodiments, the retractable baffles 225 may be walls having multiple vertical folded portions, that sit between the IT equipment 210 and/or ACUs 215. The walls fold accordion-like when stored, between at least one ACU 215 and the IT equipment 210 and extend outward toward the walls of edge container 202 to attach to the outer edge container 202 walls, thereby forming the temporary vestibule.

In one or more embodiments, the retractable baffles 225 are attached to the inside edge container walls and may deploy by folding inward from the edge container walls towards the IT equipment 210 and the ACUs 215.

Figure 7:
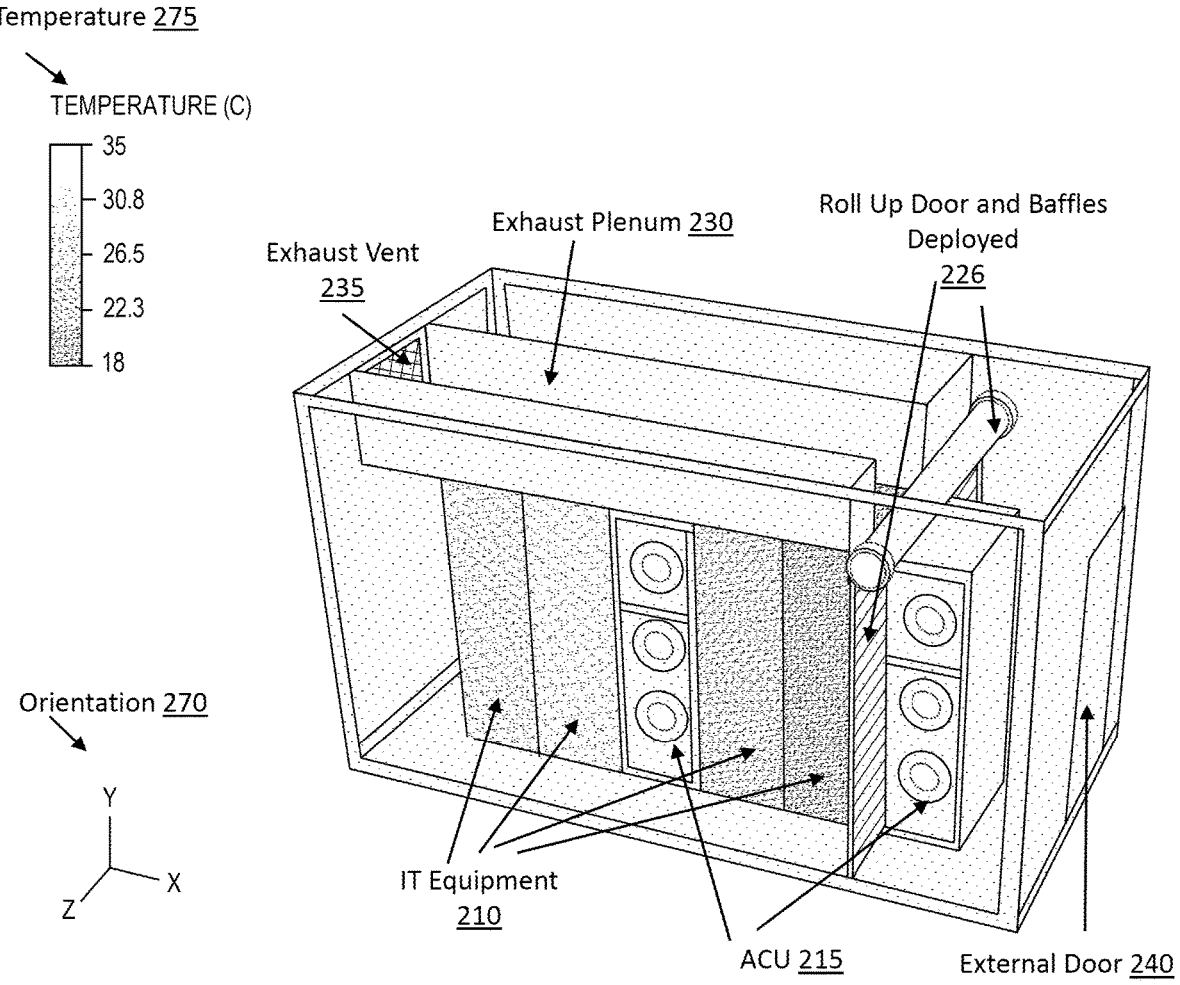
FIG. 7 illustrates an exemplary edge container with the deployed baffles comprising a roll up garage door.

In one or more embodiments, the retractable baffles 225 may be an overhead roll up door 226, as in FIG. 7. The roll up door 226 may be fixed to the ceiling of the edge container 202. The roll up door 226 may be fixed to the sides of the edge container 202, as shown, such that when rolled down, the temporary vestibule is formed.

Figure 8:
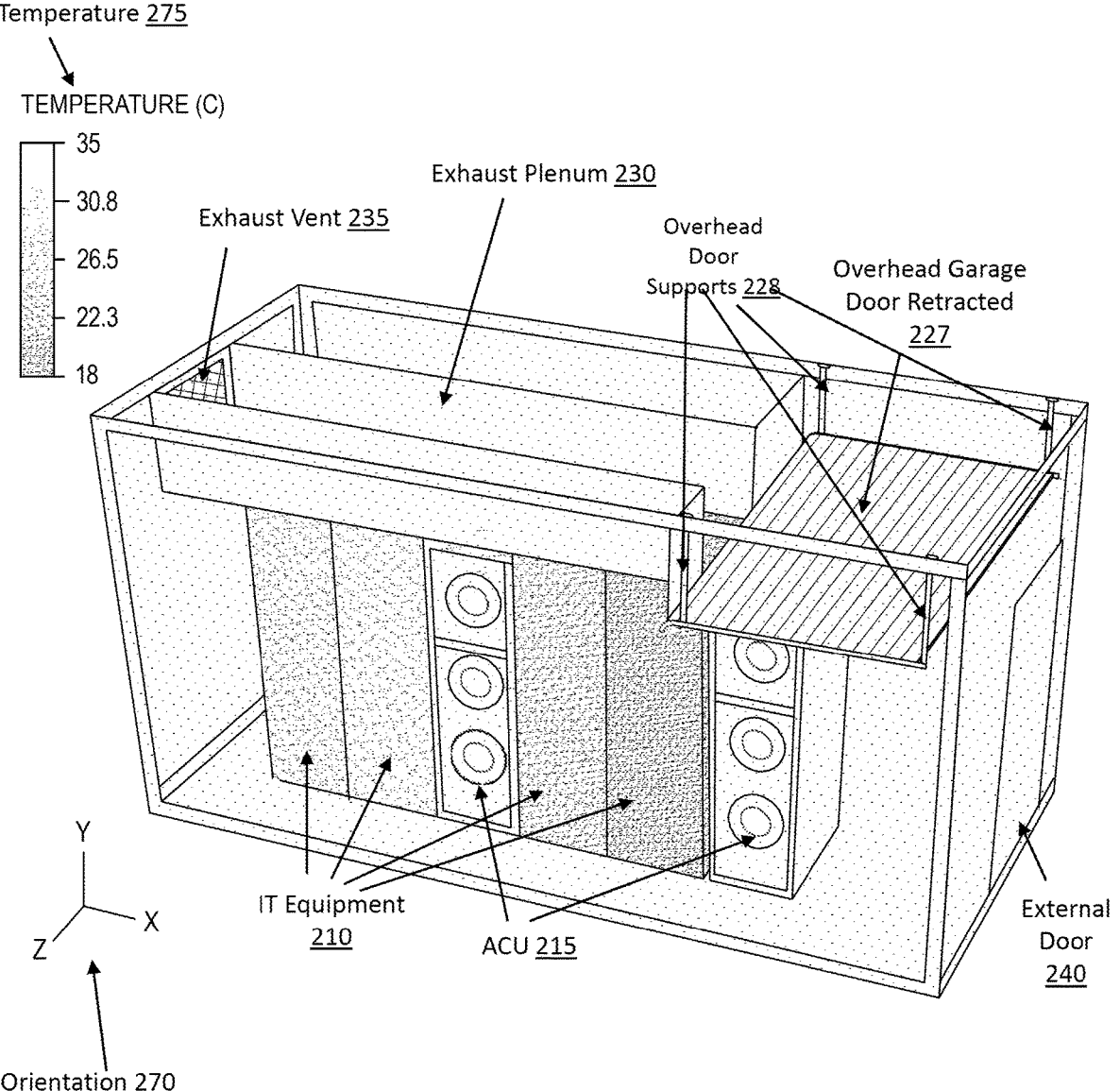
FIG. 8 illustrates an exemplary edge container with the retracted baffles comprising an overhead door on a track.

In one or more embodiments, the retractable baffles 225 may be an overhead door on a track 227 (similar to a garage door), as in FIG. 8. The overhead door 227 is attached to the ceiling of the edge container 202 by overhead door supports 228, which support the track on which the overhead door 227 deploys. FIG. 9 illustrates the overhead door 227 being deployed and creating the temporary vestibule.

Figure 11:
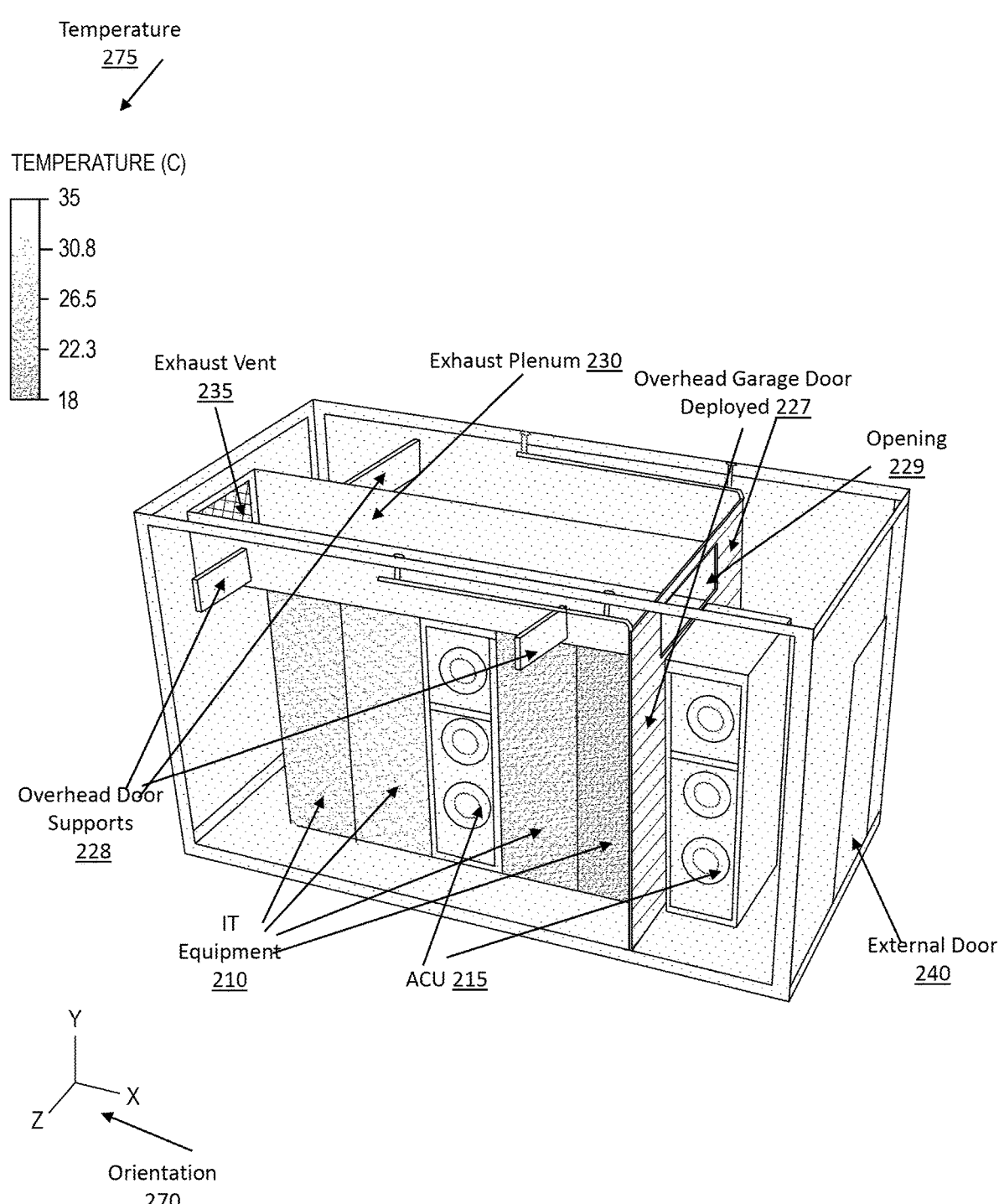
FIG. 11 illustrates an exemplary edge container as in FIG. 10, with the baffles deployed.

In one or more embodiments, the retractable baffles 225 may be an overhead door on a track 227 (similar to a garage door), as in FIG. 8. Here in FIG. 10, however, the overhead door 227 is stored on a track that is attached to the overhead door support 228, which are attached to the ceiling of the edge container 202. When retracted, the overhead door 227 is stored above the exhaust plenum 230. As shown in FIG. 11, when deployed the overhead door 227 does not obstruct the exhaust plenum 230 opening. An opening 229 fits over the exhaust plenum 230 such that the temporary vestibule is formed but air entering through an open external door 240 does leak behind the temporary vestibule into the edge container 202.

The exhaust plenum 230 operates when the retractable baffles 225 are fully engaged (deployed) and the external door 240 is open to allow a path for the removal of external air such that the IT equipment 210 is never exposed to foreign contaminants.

The exhaust vent 235 is located in the wall of the edge container 202 that is opposite the external door 240. The exhaust vent 235 is directly connected to the end of the exhaust plenum 230 such that the air that enters the edge container 202 when external door 240 is open is directly exhausted through the exhaust vent 235. Alternatively, the exhaust vent 235 is not directly attached, but must be within the exhaust plenum 230 space. The opposite end of the exhaust plenum 230 that opens into the edge container 202 may be closed by a series of manually or automatically operated dampers to control air infiltration.

In one or more embodiments, the exhaust vent 235 includes a cover, such as louvers that are closed during normal operation when the external door 240 is closed.

Authorized service personnel enter/exit the edge container 202 through the external door 240. The external door 240 includes an interlock switch 245 to ensure that the external door 240 remains locked and is not opened until the retractable baffles 225 are fully engaged.

In some embodiments, there can be more than one external door 240, so long as each door is within the vestibule. This can include more than one external door 240 on the same wall of the edge container 202. Alternatively, an external door 240 is as shown in FIGS. 4-6, and another door is in an adjacent edge container 202 wall.

A user verification device 250, such as a badge reader, or biometric device (e.g., fingerprint reader, eye scanner, etc.) verifies that someone seeking entry to the edge container 202 is authorized for entry before the interlock switch 245 releases the external door 240 to allow entry. The user verification device 250 can be located on the external door 240, or on a wall of the edge container 202 proximate to the external door 240.

The edge container service control module 255 controls the edge container 202 and all its components through program instructions that are sent to and received from, for example, a remote networked computer. Alternatively, or in addition, the edge container service control module 255 operates through one or more devices of the IT equipment 210.

Figure 3:
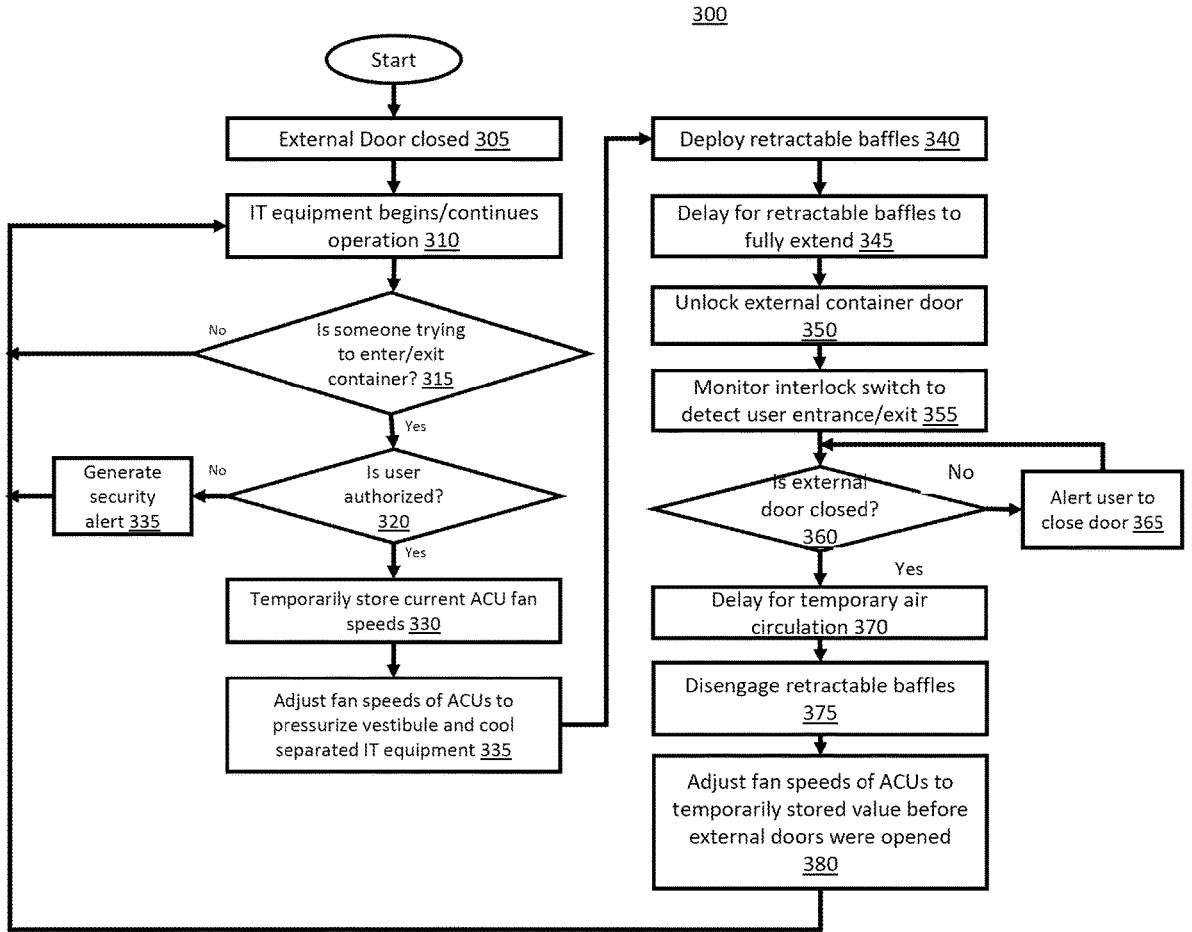
FIG. 3 illustrates an exemplary edge container service control module flow diagram 300, in accordance with one or more aspects of the present invention.

FIG. 3 shows a flow chart 300 in which the edge container service control module 255 sends/receives program instructions to control the edge container 202 and all its components, particularly during a service event to protect the IT equipment 210.

The method 300 begins at decision block 305 with closed external door(s) 240 of the edge container 202. Verification of a closed door is done by checking the status of the interlock switch 245.

At block 310, the edge container service control module 255 begins/continues the operation of the IT equipment 210 within the edge container 202. The operational state of the edge container 202 with the baffles 225 retracted is shown in FIG. 6.

At decision block 315, the edge container service control module 255 determines if anyone (e.g., service personnel) is trying to enter or exit the edge container 202. This can be detected using user verification device 250, motion sensors, security cameras, etc.

If entry/exit is not being attempted (block 315 "No" branch), the edge container service control module 255 loops back to block 310 to continue operation of the IT equipment 210 and to continue monitoring for attempts to enter/exit the edge container 202.

If entry/exit is being attempted (block 315 "Yes" branch), the edge container service control module 255 moves to decision block 320 to determine if the user is authorized, for example, by reading output from the user verification device 250.

If the user is not authorized (block 320 "No" branch), the edge container service control module 255 executes block 335 to generate a security alert before looping back to block 310. In one or more embodiments, the security alert may include sending notifications to security team members (e.g., email, text message, etc.) and may also include activating alarms on the edge container 202. In one or more embodiments, security alerts may also be triggered by a malicious attempt at tampering with the edge container 202. In one or more embodiments, more drastic security measures may be taken where the edge container 202 may be locked to prevent anyone from entering or exiting for a configurable threshold period of time.

If the user is authorized (block 320 "Yes" branch), the edge container control module 255 proceeds to block 330 to temporarily store the current ACU 215 fan speeds, for example, in the edge container control module 255 memory. These fan speeds will be restored later at block 380.

At block 335, the edge container control module 255 calls the fan speed controller 220 to adjust the ACU 215 fan speeds in preparation for the closing (deploying) of the retractable baffles 225.

The ACU(s) 215 on the vestibule side (separated from IT equipment 210 when the retractable baffles 225 are deployed) will be altered to a level that will pressurize the vestibule. The ACUs 215 on the IT equipment 210 side of the retractable baffles 225 will be increased to maintain cooling of all the IT equipment 210.

In one or more embodiments, if the environmental conditions in and around the edge container 202 are such that the ACUs 215 cannot be adjusted to maintain cooling of the IT equipment 210 when retractable baffles 225 are deployed, service personnel may be notified that they must wait before entering or, in an emergency, the workload at the edge container 202 may begin to be offloaded to another data center site until a level is reached where the temperature is within the operating range of the IT equipment 210.

Once the ACUs 215 have fully adjusted, the edge container control module 255 continues to block 340 to deploy the retractable baffles 240. At block 345, there is a delay that is long enough to ensure that the retractable baffles 225 are fully extended. This can be accomplished by manually entering an amount of time. Alternatively, a series of sensors in the edge container 202 and/or on the external door 240 can determine when the deployment is complete.

The external door 240 is then unlocked at block 350, allowing the authorized personnel to either enter the vestibule created by the retractable baffles 225, or to exit the edge container 202 if the authorized user is already in the vestibule after completing the service event.

The edge container control module 255 then executes block 355 where the interlock switch 245 is monitored to detect authorized personnel entrance or exit.

The edge container control module 255 then moves to decision block 360 to determine if a configurable amount of time has expired between the opening and closing of the external door 240 after the entrance/exit of the authorized personnel. If the external door 240 has been closed (block 360 "No" branch), the edge container control module 355 alerts the authorized personnel to close the door at block 365, for example, by audible alarms and/or text messages on the user's connected device.

If the external door 240 has been closed (block 360 "Yes" branch), the edge container control module 255 delays temporarily at block 370 to allow air to circulate that entered the edge container 202 while the external door 240 was open. This delay also allows for any contaminants that may have been in the air to be flushed from the edge container 202 through the exhaust vent 235. The calculation of the delay depends on the volume of the space in the edge container 202.

The retractable baffles 225 are then disengaged at block 375. The ACU 215 fan speeds are then restored to the values that were temporarily stored (from block 330).

The edge container control module 255 then loops back to block 310 to continue operation of the edge container 202.

What is claimed is:
1. A method, comprising:
determining a fan speed for one or more air conditioning unit (ACU) fans and storing the fan speeds to a computer memory for later recall in response to detecting a request for authorized entrance to a modular data center;

adjusting the one or more ACU fans in preparation to deploying one or more retractable baffles that, when deployed, form a temporary vestibule within a space of the modular data center;

deploying the one or more retractable baffles to form the temporary vestibule within the space of the modular data center, thereby shielding computing resources in the modular data center from contaminant air that enters the temporary vestibule when the external door is open;

unlocking the external door to allow entry to the temporary vestibule;

detecting the entry into the temporary vestibule and closure of the external door;

purging the contaminant air from the temporary vestibule;

retracting the one or more retractable baffles, exposing computing resources in the modular data center to the space used for the temporary vestibule; and restoring the one or more ACU fans to the one or more fan speeds from the computer memory.

2. The method of claim 1, further comprising a first set of one or more ACU fans for a computing resources portion of the modular data center, and a second set of one or more ACU fans for the temporary vestibule:

wherein the first set of one or more ACU fans adjusts to maintain cooling of the computing resources; and the second set of one or more ACU fans pressurizes the temporary vestibule.

3. The method of claim 1, wherein at least one ACU fan is interposed between the one or more retractable baffles and the external door.

4. The method of claim 1, wherein the ACU fans purge the contaminant air from the vestibule through an exhaust plenum directly connected to an exhaust fan inserted in a wall of the modular data center.

5. The method of claim 1, wherein the retractable baffles include an overhead roll up door.

6. The method of claim 1, wherein the retractable baffles include an overhead door on a track.

7. The method of claim 1, wherein the ACU fan speed in the portion of the edge container that is outside the temporary vestibule is adjusted to maintain a temperature within an operating range of the computing resources in the modular data center, in response to the opening of the external door.

8. A computer program product, the computer program product comprising a non-transitory tangible storage device having program code embodied therewith, the program code executable by a processor of a computer to perform a method, the method comprising:

determining a fan speed for one or more air conditioning unit (ACU) fans and storing the fan speeds to a computer memory for later recall in response to detecting a request for authorized entrance to a modular data center;

adjusting the one or more ACU fans in preparation to deploying one or more retractable baffles that, when deployed, form a temporary vestibule within a space of the modular data center;

deploying the one or more retractable baffles to form the temporary vestibule within the space of the modular data center, thereby shielding computing resources in the modular data center from contaminant air that enters the temporary vestibule when the external door is open;

unlocking the external door to allow entry to the temporary vestibule;

detecting the entry into the temporary vestibule and closure of the external door;

purging the contaminant air from the temporary vestibule;

retracting the one or more retractable baffles, exposing computing resources in the modular data center to the space used for the temporary vestibule; and restoring the one or more ACU fans to the one or more fan speeds from the computer memory.

9. The computer program product of claim 8, further comprising a first set of one or more ACU fans for a computing resources portion of the modular data center, and a second set of one or more ACU fans for the temporary vestibule:

wherein the first set of one or more ACU fans adjusts to maintain cooling of the computing resources; and the second set of one or more ACU fans pressurizes the temporary vestibule.

10. The computer program product of claim 8, wherein at least one ACU fan is interposed between the one or more retractable baffles and the external door.

11. The computer program product of claim 8, wherein the ACU fans purge the contaminant air from the vestibule through an exhaust plenum directly connected to an exhaust fan inserted in a wall of the modular data center.

12. The computer program product of claim 8, wherein the retractable baffles include an overhead roll up door.

13. The computer program product of claim 8, wherein the retractable baffles include an overhead door on a track.

14. The computer program product of claim 8, wherein the ACU fan speed in the portion of the edge container that is outside the temporary vestibule is adjusted to maintain a temperature within an operating range of the computing resources in the modular data center, in response to the opening of the external door.

15. A computer system, comprising:

one or more processors;

a memory coupled to at least one of the processors;

a set of computer program instructions stored in the memory and executed by at least one of the processors in order to perform actions of:

determining a fan speed for one or more air conditioning unit (ACU) fans and storing the fan speeds to a computer memory for later recall in response to detecting a request for authorized entrance to a modular data center;

adjusting the one or more ACU fans in preparation to deploying one or more retractable baffles that, when deployed, form a temporary vestibule within a space of the modular data center;

deploying the one or more retractable baffles to form the temporary vestibule within the space of the modular data center, thereby shielding computing resources in the modular data center from contaminant air that enters the temporary vestibule when the external door is open;

unlocking the external door to allow entry to the temporary vestibule;

detecting the entry into the temporary vestibule and closure of the external door;

purging the contaminant air from the temporary vestibule;

retracting the one or more retractable baffles, exposing computing resources in the modular data center to the space used for the temporary vestibule; and restoring the one or more ACU fans to the one or more fan speeds from the computer memory.

16. The computer system of claim 15, further comprising a first ACU fan for a computing resources portion of the modular data center, and a second ACU fan for the temporary vestibule:

wherein the first ACU fan adjusts to maintain cooling of the computing resources, and the second ACU fan pressurizes the temporary vestibule.

17. The computer system of claim 15, wherein the ACU fans purge the contaminant air from the vestibule through an exhaust plenum directly connected to an exhaust fan inserted in a wall of the modular data center.

18. The computer system of claim 15, wherein the retractable baffles include an overhead roll up door.

19. The computer system of claim 15, wherein the retractable baffles include an overhead door on a track.

20. The computer system of claim 15, wherein the ACU fan speed in the portion of the edge container that is outside the temporary vestibule is adjusted to maintain a temperature within an operating range of the computing resources in the modular data center, in response to the opening of the external door.

\* \* \* \* \*